US012483255B2

(12) United States Patent
Zhang et al.

(10) Patent No.: US 12,483,255 B2
(45) Date of Patent: Nov. 25, 2025

(54) SELF-CALIBRATING BUFFERED-VOLTAGE DAC

(71) Applicant: NXP B.V., Eindhoven (NL)

(72) Inventors: Yizhong Zhang, Suzhou (CN); Jie Jin, Suzhou (CN); Yikun Mo, Suzhou (CN); Hongyan Yao, Suzhou (CN); Linhao Cao, Suzhou (CN); Sitong Wang, Suzhou (CN)

(73) Assignee: NXP B.V., Eindhoven (NL)

( * ) Notice: Subject to any disclaimer, the term of this patent is extended or adjusted under 35 U.S.C. 154(b) by 217 days.

(21) Appl. No.: 18/479,131

(22) Filed: Oct. 2, 2023

(65) Prior Publication Data
US 2024/0195427 A1 Jun. 13, 2024

(30) Foreign Application Priority Data
Dec. 12, 2022 (CN) .......................... 202211597848.8

(51) Int. Cl.
H03M 1/06 (2006.01)
(52) U.S. Cl.
CPC .................................. H03M 1/0602 (2013.01)
(58) Field of Classification Search
CPC ........ H03M 1/66; H03M 1/86; H03M 1/1009; H03M 1/1019; H03M 1/0602
See application file for complete search history.

(56) References Cited

U.S. PATENT DOCUMENTS 5,627,537 A 5/1997 Quinlan et al.
5,642,116 A * 6/1997 Gersbach ............ H03M 1/1052
341/145
5,818,370 A * 10/1998 Sooch ................... H03M 3/356
341/110
5,894,280 A * 4/1999 Ginetti ............... H03M 1/1019
341/120
RE38,083 E 4/2003 Ashe
(Continued)

FOREIGN PATENT DOCUMENTS

WO 9616481 A2 5/1996
WO 0213392 A2 2/2002

OTHER PUBLICATIONS

Xu et al.: "Research of Segmented 8bit Voltage-Mode R-2R Ladder DAC", 2015 IEEE 11th International Conference on ASIC (ASICON), Nov. 3-6, 2015, pp. 1-4.

Primary Examiner — Lam T Mai

(57) ABSTRACT

A self-calibrated buffered-voltage DAC includes a DAC configured to receive an input digital signal and output a first analog voltage signal, a buffer amplifier configured to receive the first voltage signal from the DAC and provide a buffered second analog voltage signal, a voltage to frequency converter configured to selectively receive the first and second voltage signals and provide first and second output signals at respective first and second frequencies, a counter configured to receive the output signals from the voltage to frequency converter and provide respective first and second digital output signals corresponding to the respective first and second frequencies, a comparator configured to receive the first and second digital output signals and provide a digital calibration offset, and a DAC error code module configured to receive a digital input code and the digital calibration offset and to provide an offset corrected input digital signal to the DAC.

20 Claims, 6 Drawing Sheets

(56) References Cited

U.S. PATENT DOCUMENTS

| | | | |
|---|---|---|---|
| 6,633,246 B1 | 10/2003 | Bowers | |
| 8,031,098 B1* | 10/2011 | Ebner | H03M 1/1061 |
| | | | 341/146 |
| 8,581,766 B1 | 11/2013 | Li et al. | |
| 9,083,380 B2 | 7/2015 | Price et al. | |
| 9,954,547 B1* | 4/2018 | Azenkot | H03K 5/135 |
| 9,973,203 B1* | 5/2018 | Azenkot | H03M 1/662 |
| 10,122,372 B1* | 11/2018 | Huber | H03M 1/0607 |
| 10,305,504 B1* | 5/2019 | Azenkot | H03D 7/165 |
| 10,516,412 B1* | 12/2019 | Mehdizad Taleie | H03M 1/662 |
| 10,812,094 B2* | 10/2020 | Huang | H03M 1/1023 |
| 10,903,846 B1* | 1/2021 | Liu | H03M 1/0678 |
| 11,356,111 B1* | 6/2022 | Xing | H03M 1/785 |
| 11,424,754 B1* | 8/2022 | Berens | H03M 1/1057 |
| 2005/0052301 A1* | 3/2005 | Mills | H03M 1/0643 |
| | | | 341/144 |
| 2005/0146452 A1* | 7/2005 | Kuyel | H03M 1/1042 |
| | | | 341/120 |
| 2005/0270208 A1* | 12/2005 | Kwon | H03M 1/1061 |
| | | | 341/144 |
| 2010/0033358 A1* | 2/2010 | Sahu | H03M 1/108 |
| | | | 341/120 |
| 2014/0167988 A1* | 6/2014 | Hong | H03M 1/1061 |
| | | | 341/110 |
| 2014/0266835 A1 | 9/2014 | Price et al. | |
| 2016/0056834 A1 | 2/2016 | Frank | |
| 2019/0081636 A1* | 3/2019 | Chen | H03M 1/002 |
| 2019/0190531 A1* | 6/2019 | Martens | H03M 1/46 |
| 2019/0207616 A1* | 7/2019 | Chen | H03M 1/1014 |
| 2020/0021280 A1* | 1/2020 | Miller | H03K 5/24 |
| 2020/0162091 A1* | 5/2020 | Huang | H03M 1/0607 |
| 2020/0177120 A1* | 6/2020 | Pullen | H02P 23/14 |
| 2023/0066987 A1* | 3/2023 | Zhang | H03M 1/1057 |

* cited by examiner

SELF-CALIBRATING BUFFERED-VOLTAGE DAC

CROSS-REFERENCE TO RELATED APPLICATIONS

This application claims priority under 35 U.S.C. § 119 to Chinese patent application no. 202211597848.8, filed 12 Dec. 2022, the contents of which are incorporated by reference herein.

FIELD

The disclosure relates to self-calibration of a buffered-voltage digital to analog converter (DAC).

BACKGROUND

A buffer provides a way to pass a signal between components of different impedances. The goal is to preserve the output and provide an accurate and reliable signal to a subsequent stage. A voltage buffer does this by changing current whilst keeping the voltage constant. Combining an unbuffered voltage DAC with an operational amplifier, or op-amp, forms a buffered-voltage DAC. There are many solutions to improve buffered voltage DAC accuracy, but an op-amp input offset is difficult to be calibrated for, particularly for high power or high speed applications.

At low speeds, a chopping/auto zero op-amp can be used. This corrects for an input offset using two clock phases and a separate nulling amplifier. Voltages generated during the two clock phases are stored on separate capacitors and form the basis of the calibration. However, this solution is generally limited to applications with sampling rates of less than around 300 ksps (i.e. 300,000 samples per second).

For higher speeds (for example over around 1 Msps), op-amp offset trimming can be used, in which the offset voltage is adjusted by programming digitally weighted current sources. Physically this involves blowing polysilicon fuses on the circuit board based on codes generated from digitizing the error. The result is that, once calibrated, there is no way to adjust for any temperature/voltage dependence.

Designing a high accuracy voltage buffered DAC that can be easily calibrated and operates over a wide range of speeds, input voltages and temperatures is therefore an important problem to solve.

SUMMARY

According to a first aspect there is provided a self-calibrating buffered-voltage DAC with a DAC configured to receive an input digital signal and output a first analog voltage signal, a buffer amplifier configured to receive the first voltage signal from the DAC and provide a buffered second analog voltage signal, a voltage to frequency converter configured to selectively receive the first and second voltage signals and provide first and second output signals at respective first and second frequencies, a counter configured to receive the output signals from the voltage to frequency converter and provide respective first and second digital output signals corresponding to the respective first and second frequencies, a comparator configured to receive the first and second digital output signals and provide a digital calibration offset, and a DAC error code module configured to receive a digital input code and the digital calibration offset and to provide an offset corrected input digital signal to the DAC.

The self-calibrating buffered-voltage DAC circuit may further include a first switch switchably connecting an output of the DAC to an input of the voltage to frequency converter, and a second switch switchably connecting an output of the buffer amplifier to the input of the voltage to frequency converter.

The self-calibrating buffered-voltage DAC circuit may further include a controller configured to provide first and second switching signals to control operation of the respective first and second switches. The controller may be configured to provide the first and second switching signals to open the first switch and close the second switch in a normal operation mode, and provide the first and second switching signals to sequentially open and close the first and second switches to sequentially provide the first and second voltage signals to the voltage to frequency converter in a calibration mode.

The self-calibrating buffered-voltage DAC circuit may further include a clock signal generator configured to provide a clock signal at a clock signal frequency to the counter, the counter configured to provide the first and second digital output signals by dividing the clock signal frequency by the respective first and second frequencies.

The self-calibrating buffered-voltage DAC circuit may further include a first frequency divider configured to divide the frequency of the clock signal to provide a divided clock signal to the counter.

The self-calibrating buffered-voltage DAC circuit may further include a second frequency divider configured to divide the frequency of the first and second voltage signals and provide divided first and second output signals to the counter.

The self-calibrating buffered-voltage DAC circuit may further include a memory module with first and second memory slots, the memory module configured to receive the first and second digital output signals and store the first and second digital output signals in the respective first and second memory slots. The comparator may be configured to receive the first and second digital output signals from the respective first and second memory slots. The memory module may include third and fourth switches configured to switchably connect the first and second digital output signals to the respective first and second memory slots.

The comparator module may be configured to calculate the digital calibration offset as a difference between the first and second digital output signals.

The DAC error code module may include a DAC error code logic module configured to compare the digital calibration offset to a predetermined minimum offset, output the digital calibration offset to the DAC input summing module if the digital calibration offset is not less than the predetermined minimum offset, and output a zero value to DAC input summing module if the digital calibration offset is less than the predetermined minimum offset.

According to a second aspect there is provided a method of calibrating a buffered-voltage DAC, the buffered-voltage DAC including a DAC configured to receive an input digital signal and provide a first analog voltage signal, and a buffer amplifier configured to receive the first voltage signal from the DAC and provide a buffered second analog voltage signal. The method includes providing the first voltage signal to a voltage to frequency converter, measuring a first frequency from an output of the voltage to frequency converter, providing the second voltage signal to the voltage to frequency converter, measuring a second frequency from the output of the voltage to frequency converter, calculating a difference between the first and second frequencies, determining a digital calibration offset from the difference, combining the digital calibration offset with an input digital signal to provide an offset corrected input digital signal, and providing the corrected input digital signal to the DAC.

The method may further include connecting an output of the DAC to an input of the voltage to frequency converter with a first switch, and connecting an output of the buffer amplifier to the input of the voltage to frequency converter with a second switch.

A controller may provide first and second switching signals to control operation of the respective first and second switches. The controller may provide the first and second switching signals to open the first switch and close the second switch in a normal operation mode, and provide the first and second switching signals to sequentially open and close the first and second switches to sequentially provide the first and second voltage signals to the voltage to frequency converter in a calibration mode.

A memory module including first and second memory slots may receive the first and second digital output signals and store the first and second digital output signals in the respective first and second memory slots. The comparator may receive the first and second digital output signals from the respective first and second memory slots. The memory module may connect the first and second digital output signals to the respective first and second memory slots via respective third and fourth switches.

A logic module may compare the digital calibration offset to a predetermined minimum offset, output the digital calibration offset to the DAC input summing module if the digital calibration offset is not less than the predetermined minimum offset, and output a zero value to DAC input summing module if the digital calibration offset is less than the predetermined minimum offset.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which.

Figure 1:
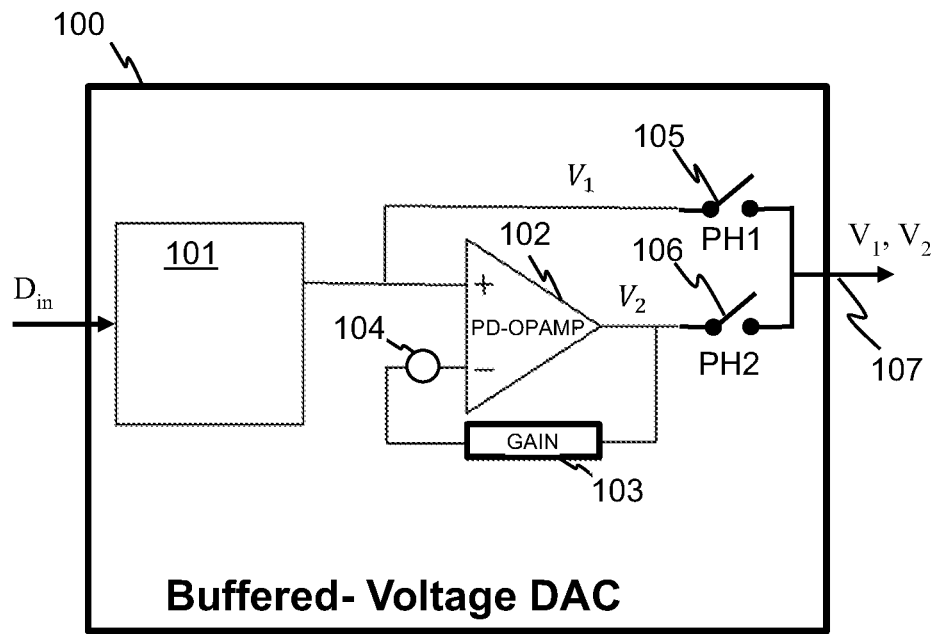
FIG. 1 is a schematic diagram of an example buffered-voltage DAC.

It should be noted that the Figures are diagrammatic and not drawn to scale. Relative dimensions and proportions of parts of these Figures have been shown exaggerated or reduced in size, for the sake of clarity and convenience in the drawings. The same reference signs are generally used to refer to corresponding or similar feature in modified and different embodiments.

DETAILED DESCRIPTION OF EMBODIMENTS

FIG. 1 illustrates an example buffered-voltage DAC 100. The buffered-voltage DAC 100 comprises a DAC 101 and an op-amp 102. The DAC 101, which may for example be an R-2R DAC, receives an input digital signal $D_{in}$ and outputs a first analog voltage signal $V_1$. The op-amp 102 acts as a buffer amplifier, receiving the first voltage signal $V_1$ from the DAC 101 at its non-inverting input and providing a buffered second analog voltage signal $V_2$ at its output, with a gain between the input and output defined by a feedback resistance 103 connected between the inverting input and the output of the op-amp 102. The second analog voltage signal $V_2$ may be used to pass a signal between two components of different impedances connected at the input of the DAC 101 and the output 107 of the buffered voltage DAC 100. In the embodiments described in this disclosure, a unity gain is used. In other embodiments, gain values other than unity may be selected.

An input offset variation, represented here by voltage source 104 providing an offset voltage $V_{os}$, is intrinsic to the op-amp 102 and, with a unity gain, leads to a voltage difference between the first and second analog voltage signals $V_1$ and $V_2$, i.e. $V_2=V_1+V_{os}$. This voltage difference requires calibration to improve the accuracy of the buffered voltage DAC 100. A calibration may be applied to account for the offset voltage by adding a digital calibration signal to the input signal $D_{in}$, but this requires an accurate measure of the voltage offset $V_{os}$. To enable this, first and second switches 105, 106 are sequentially operated by respective switching signals PH1, PH2. Switching signals PH1 and PH2 may be provided externally via a computer/test bench or via a controller provided as part of a self-calibrated buffered voltage DAC circuit. The first switch 105 switchably connects the output of the DAC 101 to the output 107 of the buffered-voltage DAC 100, bypassing the op-amp 102. The second switch 106 switchably connects the output of the op-amp 102 to the output 107 of the buffered-voltage DAC 100. In a normal mode, the first switch 105 is open and the second switch 106 is closed. In a calibration mode, as described below, the switches 105, 106 are operated so that the voltage offset $V_{os}$ can be measured by measuring $V_1$ and $V_2$ separately and determining the difference. The difference is then used to provide a calibration offset $\Delta D_{in}$ that is applied to the input digital signal $D_{in}$.

Figure 2:
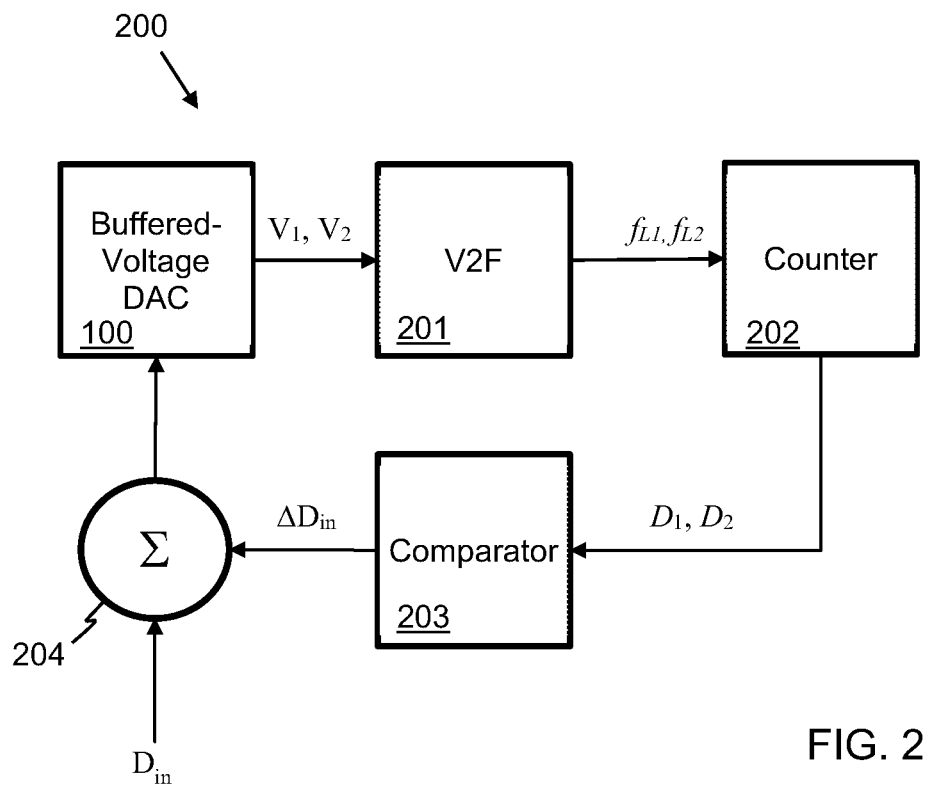
FIG. 2 is a schematic diagram of an example self-calibrated buffered voltage DAC.

FIG. 2 illustrates an example self-calibrating buffered voltage DAC 200 comprising the buffered-voltage DAC 100 as described above. The self-calibrating buffered voltage DAC 200 further comprises a voltage to frequency (V2F) converter 201, counter 202, comparator 203 and a DAC input summing module 204. The first and second voltage signals $V_1$, $V_2$ are measured by first converting to signals having respective frequencies $f_{L1}$, $f_{L2}$ by the V2F converter 201, measuring the frequencies with the counter 202 and determining a difference $\Delta D_{in}$ with the comparator 203, which is then combined with an input digital signal $D_{in}$ to provide an offset corrected input digital signal $D_{in}-\Delta D_{in}$ to the DAC 101.

During a calibration mode, the voltage to frequency converter 201 receives the first voltage signal $V_1$, providing a first output signal with a first frequency $f_{L1}$ and receives the second voltage signal $V_2$, providing a second output signal with a second frequency $f_{L2}$. Operation of the first and second switches 105, 106 (FIG. 1) connects the first and second voltage signals to the V2F converter 201. The voltage to frequency converter 201 may comprise a voltage-controlled oscillator (VCO), for example in the form of a ring oscillator as described in more detail below with reference to FIG. 4.

The counter 202 is configured to receive the first and second frequencies $f_{L1}$, $f_{L2}$ from the voltage to frequency converter 201 and provide respective first and second digital output signals $D_1$ and $D_2$ corresponding to the respective first and second frequencies $f_{L1}$, $f_{L2}$.

The comparator 203 is configured to receive the first and second digital output signals $D_1$, $D_2$ and provide a digital calibration offset $\Delta D_{in}$, which is determined by calculating $\Delta D_{in} = D_1 - D_2$. The digital calibration offset $\Delta D_{in}$ corresponds to the offset error caused by the op-amp input offset variation $V_{os}$.

The DAC input summing module 204 is configured to receive the digital input code $D_{in}$ and the digital calibration offset $\Delta D_{in}$. In certain embodiments, the digital input code $D_{in}$ may arise directly from connecting a physical component to the DAC input summing module 204 and in other embodiments it may be simulated by an external computer/test bench. The DAC input summing module 204 provides an offset corrected input signal $D_{in} - \Delta D_{in}$ to the buffered voltage DAC 100. This offset corrected input signal $D_{in} - \Delta D_{in}$ contains a correction for the op-amp input offset variation $V_{os}$ along with the desired input signal, such that the output 107 of the buffered-voltage DAC 100 in normal use has a correction for the offset voltage $V_{os}$.

Figure 3:
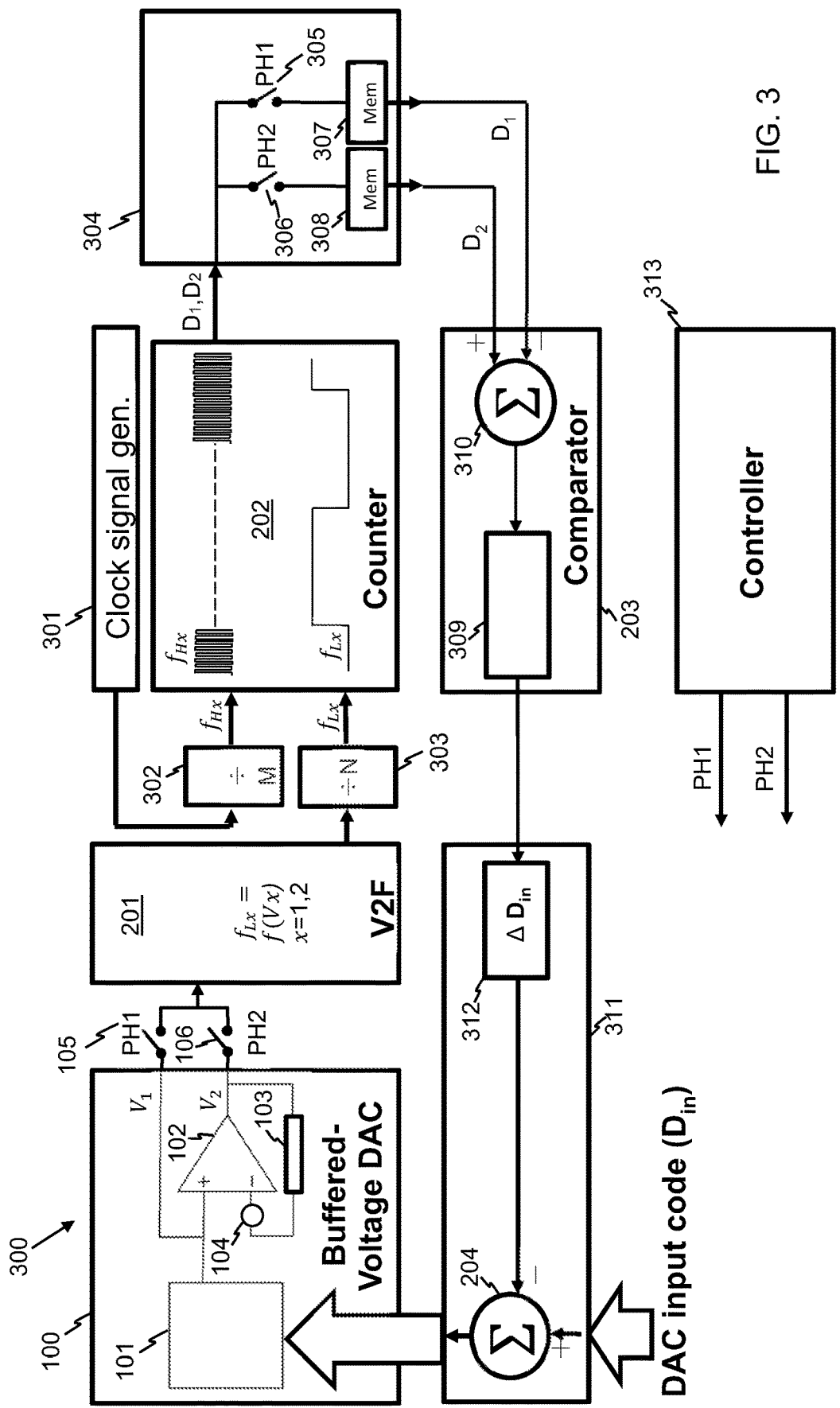
FIG. 3 is a schematic diagram of a further example self-calibrated buffered-voltage DAC.

FIG. 3 illustrates a more detailed example of a self-calibrating buffered voltage DAC 300. The self-calibrating buffered-voltage DAC 300 comprises the buffered-voltage DAC 100, V2F converter 201 and comparator 203 described above with reference to FIG. 2, together with other components that may feature in one or more embodiments. As described above in relation to FIG. 2, first and second voltage signals $V_1$, $V_2$ are measured by first converting to signals having respective frequencies $f_{L1}$, $f_{L2}$ by the V2F converter 201. These frequencies are measured by the counter 202 and a difference is determined by the comparator 203, the output from which is combined with an DAC input code $D_{in}$ by the DAC input summing module 204 to provide an offset corrected input to the buffered-voltage DAC 100.

In this embodiment, the first and second frequencies $f_{Lx}$ are measured by the counter 202 counting pulses in the signals relative to a high frequency signal clock signal with a higher frequency $f_{Hx}$, which is provided by a clock signal generator 301. The first and second frequencies $f_{Lx}$ may for example be in the kHz region and the high frequency, or reference, clock signal provided by the clock signal generator 301 may be in the MHz region, corresponding to a three order of magnitude difference between the two frequencies. To provide a desired degree of accuracy in measuring the frequencies $f_{Lx}$, the frequency $f_{Hx}$ of the clock signal may be greater than the frequencies $f_{Lx}$ multiplied by at least a range of the DAC 101. For example, a 12 bit DAC has a range of $2^{12} = 4,096$ discrete steps. The frequency $f_{Hx}$ of the clock signal should therefore be at least $4,096 \times f_{Lmax}$, where $f_{Lmax}$ is the maximum frequency resulting from an expected maximum offset voltage $V_{os}$. With the frequencies $f_{Lx}$ for example between 10 and 100 kHz, the clock frequency $f_{Hx}$ may therefore be between around 50 MHz and 500 MHz. The counter 202 may provide a digital output signal having a range equal to or greater than that of the DAC 101. In particular embodiments, the range of the digital output signal provided by the counter 202 may be greater than the range of the DAC 101, for example by one bit or more, so that the counter 202 has a finer resolution than that of the DAC 101. If, for example, the DAC 101 has a 12 bit range, the counter may have a range of 13 bits or more.

In some embodiments, the first and/or second frequencies $f_{Lx}$ may be scaled by a frequency divider before being provided to the counter 202. As shown in FIG. 3, a first frequency divider 302 divides the clock signal frequency by a factor M to provide the reference frequency $f_{Hx}$, while a second frequency divider 303 divides the frequency of the output signal from the V2F converter 201 by N to provide the frequencies $f_{Lx}$ to the counter 202.

The counter 202 counts the first and second frequencies $f_{L1}$, $f_{L2}$ by calculating $D_x = f_H/f_{Lx}$ to determine corresponding first and second digital output signals $D_1$, $D_2$. Because these signals are generated sequentially, the digital output signals may be stored in a memory module 304 prior to being provided to the comparator 203.

The memory module 304 comprises first and second memory slots 307, 308 and third and fourth switches 305, 306. The third and fourth switches 305, 306 are configured to switchably connect the output of the counter 202 to the respective first and second memory slots 307, 308. The third and fourth switches 305, 306 may be operated by respective switching signals PH1, PH2, which are the same switching signals used for operating the first and second switches 105, 106 connecting the buffered-voltage DAC to the V2F converter 201. Using the same switching signals PH1, PH2 means that, when the first switch 105 is closed, the third switch 305 is also closed and when the second switch 106 is closed, the fourth switch 306 is also closed. Synchronising action of the first and second switches 105, 106 with the third and fourth switches 305, 306 using switching signals PH1, PH2 allows access to the correct memory slot for the first and second digital output signals $D_1$, $D_2$. In a particular embodiment, the memory module 304 may be in the form of a flash erasable programmable read-only memory.

The first and second switching signals PH1, PH2 may be provided by a controller 313, which is configured to control operation of the self-calibrated buffered-voltage DAC 300. The controller 313 may be provided as part of the same circuit 300 or may be a separate external component. In a normal operational mode, the controller 313 provides signals PH1, PH2 to close the second switch 106 and open the first switch 105 to enable the buffered-voltage DAC 100 to output a buffered output voltage signal $V_2$. In a calibration mode, the controller 313 disables the DAC input code $D_{in}$ and operates the circuit 300 by sequentially closing switches 105, 106 and corresponding switches 305, 306 to determine the digital calibration offset $\Delta D_{in}$. If the digital calibration offset $\Delta D_{in}$ is greater than a predetermined minimum, for example greater than a resolution of the DAC, the offset is provided to the DAC input summing module 204 to correct the offset in the buffered-voltage DAC 100.

The first and second memory slots 307, 308 store the respective first and second digital output signals $D_1$, $D_2$ for later calculation. In a particular embodiment, the first digital output signal $D_1$ is stored in the first memory slot 307 and the second digital output signal $D_2$ is stored in the second memory slot 308.

The comparator 203 comprises a comparator summing module 310 and a comparator logic module 309. The comparator summing module 310 is configured to receive the first and second digital output signals $D_x$ from the first and second memory slots 307, 308 once both digital output signals $D_1$, $D_2$ have been provided. The comparator logic module 309 provides a digital calibration offset $\Delta D_{in}$ to the summing module 204 once the memory slots 307, 308 have both provided output values to the comparator summing module 310. The comparator logic module 309 may be implemented in various ways, for example using a successive approximation register. The comparator summing module 310 calculates a difference between the digital output signals $D_1$, $D_2$, i.e. $\Delta D_{in} = D_1 - D_2$. The digital calibration offset $\Delta D_{in}$ corresponds to the error caused by the op-amp input offset variation $V_{os}$. In a general aspect therefore, the comparator 203 receives the first and second digital output signals $D_1$, $D_2$ and provides a digital calibration offset $\Delta D_{in}$ to the summing module 311, the digital calibration offset $\Delta D_{in}$ being a difference between the first and second digital output signals $D_1$ and $D_2$.

A DAC error code module 311 comprises the DAC input summing module 204 and a logic module 312. The logic module 312 receives the digital calibration offset $\Delta D_{in}$ and provides this to the DAC input summing module 204 depending on whether or not a calibration offset is required. The logic module 312 determines whether a calibration offset is required by comparing the magnitude of the digital calibration offset $\Delta D_{in}$ to a predetermined minimum offset value $\Delta D_{min}$. The predetermined minimum offset value $\Delta D_{min}$ may be based on the specifications of the op-amp 102 or may be chosen to ensure that the error caused by the input offset falls within a desired range. If $\Delta D_{in}$ is greater than the minimum offset value $\Delta D_{min}$ then the logic module 312 sends the digital calibration offset $\Delta D_{in}$ to the DAC input summing module 204. If $\Delta D_{in}$ is less than the minimum accepted value $\Delta D_{min}$, the logic module 311 provides a zero output to the DAC input summing module 204.

The DAC input summing module 204 receives the digital input code $D_{in}$ and the calibration offset $\Delta D_{in}$ and to provides an offset corrected digital input signal $D_{in} - \Delta D_{in}$ to the DAC 101. The offset corrected input signal $D_{in} - \Delta D_{in}$ thereby contains a correction for the op-amp input offset variation $V_{os}$.

Figure 4:
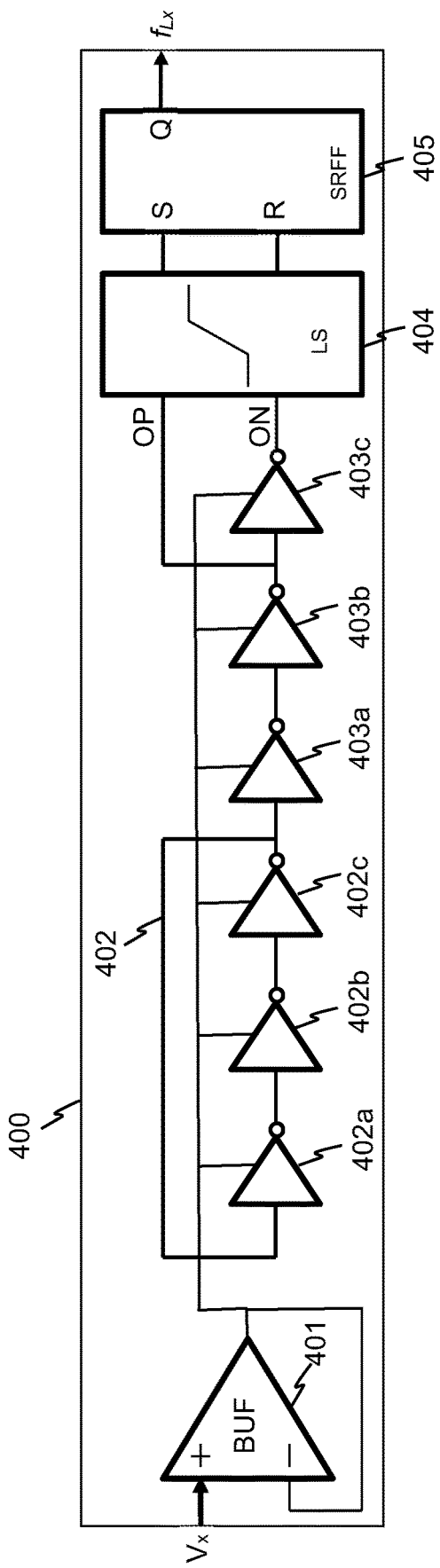
FIG. 4 is a schematic diagram of an example voltage to frequency circuit.

FIG. 4 illustrates an example voltage to frequency circuit 400 that may be provided as the V2F converter 201 in the embodiments described above. The voltage to frequency circuit 400 comprises a buffer 401, inverters 402a-c, 403a-c, a signal level indicator 404 and a set-reset flip-flop (SRFF) 405. The buffer 401 is configured to receive the output signal of the buffered voltage DAC 100, i.e. voltage signals $V_1$, $V_2$, when the circuit 300 is operating in calibration mode. The buffer 401 provides a means of impedance transformation from buffered voltage DAC 100 to the voltage to frequency circuit 201. The output signal from the buffer 401 is sent to the chain of inverters 402 a-c and 403a-c. Inverters 402 a-c form a ring oscillator 402. The feedback of the output of inverter 402c to the input of inverter 402a causes oscillations in output voltage from the ring oscillator 402 as a function of time. The ring oscillator provides an output signal with a frequency $f_{Lx}$ determined by $$f_{Lx} = \frac{1}{2t(V_x)n},$$

where $t(V_x)$ is the voltage dependent gate delay for a single inverter and n is the number of inverters in the inverter chain 402a-c (in this case n=3).

The output signal of the ring oscillator (with frequency $f_{Lx}$) is inverted twice by inverters 403a and 403b before being provided to the OP input of the signal level indicator 404. Since this signal has been inverted twice it will have an identical phase to that of $f_{Lx}$. The output signal of the ring oscillator (with frequency $f_{Lx}$) is inverted three times by inverters 403a-c before being provided to the ON input of the signal level indicator 404. Since the signal has been inverted three times it will be exactly $\pi$ out of phase with respect to the signal with frequency $f_{Lx}$. The signal level indicator is configured to receive signals OP and ON (as outlined above) at its input and measure the amplitude of the respective signals. When the signal OP reaches a pre-defined level a "set" signal is provided from the output of the signal level indicator 404 to the input of the SRFF module 405 via the "set" channel S. When signal ON reaches a pre-defined level a "reset" signal is sent from the output of the signal level indicator 404 to the input of the SRFF module 405 via the "reset" channel R.

The SRFF module 405 is configured to receive "set" signal S at its set input and "reset" signal R at its reset input. The SRFF module 405 is triggered to a high state at Q by the set signal (S) and holds the high state until reset by a low signal at the reset input (R). Since there is exactly a $\pi$ phase difference between signals sent to OP and ON as described above, the set-reset flip-flop module 405 will remain in the high state for half a cycle of $f_{Lx}$, and subsequently remain in the low state for half a cycle of $f_{Lx}$, creating a square wave trace with the same frequency as the original signal $f_{Lx}$. In other embodiments, other methods for converting a voltage to a frequency may be used.

Figure 5:
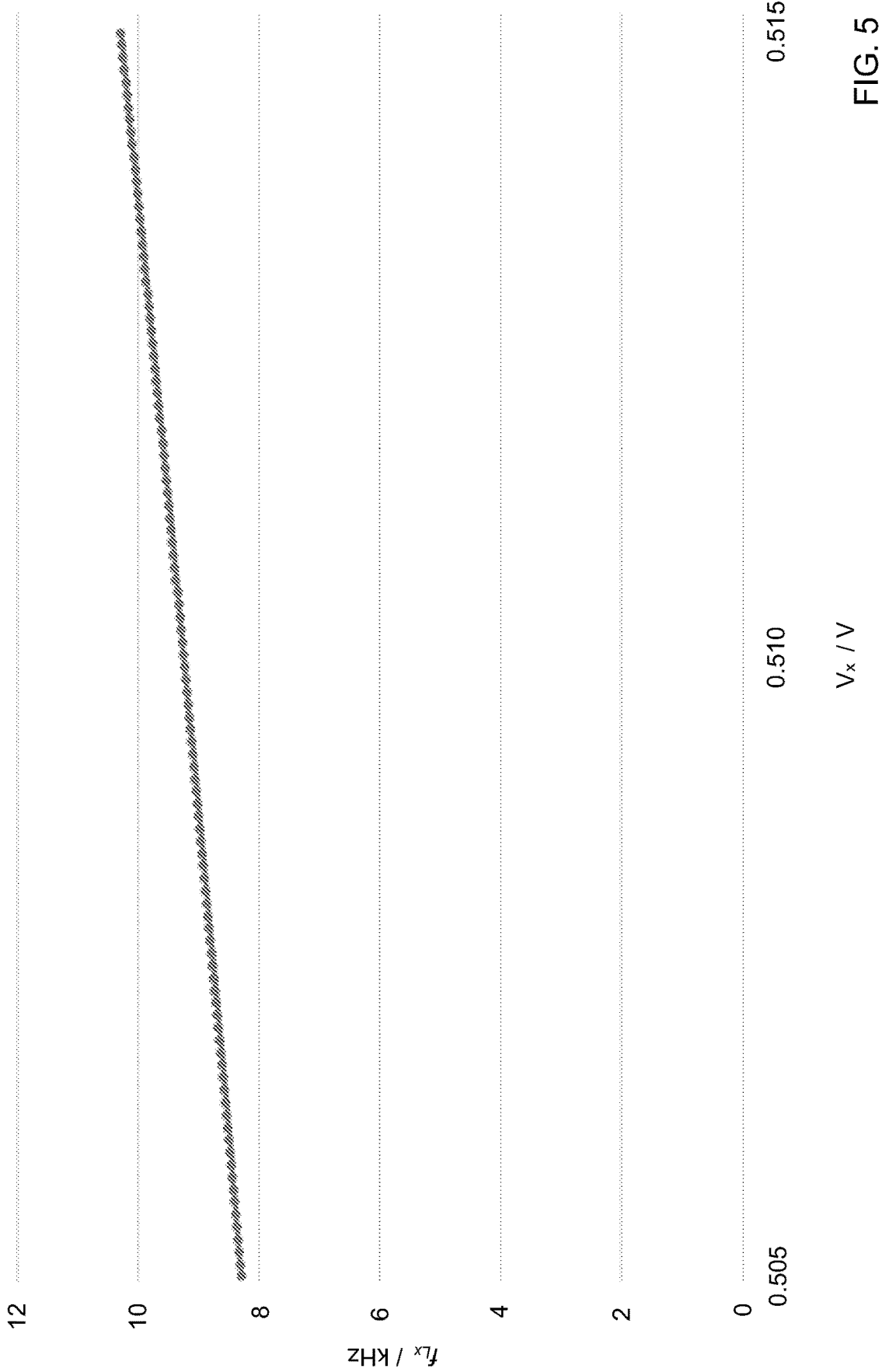
FIG. 5 is an example plot of frequency as a function of input voltage for an example voltage to frequency converter circuit.

FIG. 5 illustrates an example plot of frequency $f_{Lx}$ as a function of input voltage $V_x$ for an example voltage to frequency converter circuit. This shows a consistent linear relationship between the input voltage $V_x$ from the buffered voltage DAC and the output frequency $f_{Lx}$ over a frequency range of between around 8 and 10 kHz. In a specific embodiment that uses the voltage to frequency converter 400 of FIG. 4 as part of the self-calibrating buffered-voltage DAC 300, the frequency range of the conversion may be altered by adding or removing inverters to the ring oscillator loop 402 (as long as the total number of inverters in the ring oscillator loop is odd) in accordance with $$f_{Lx} = \frac{1}{2t(V_x)n}.$$

Figure 6:
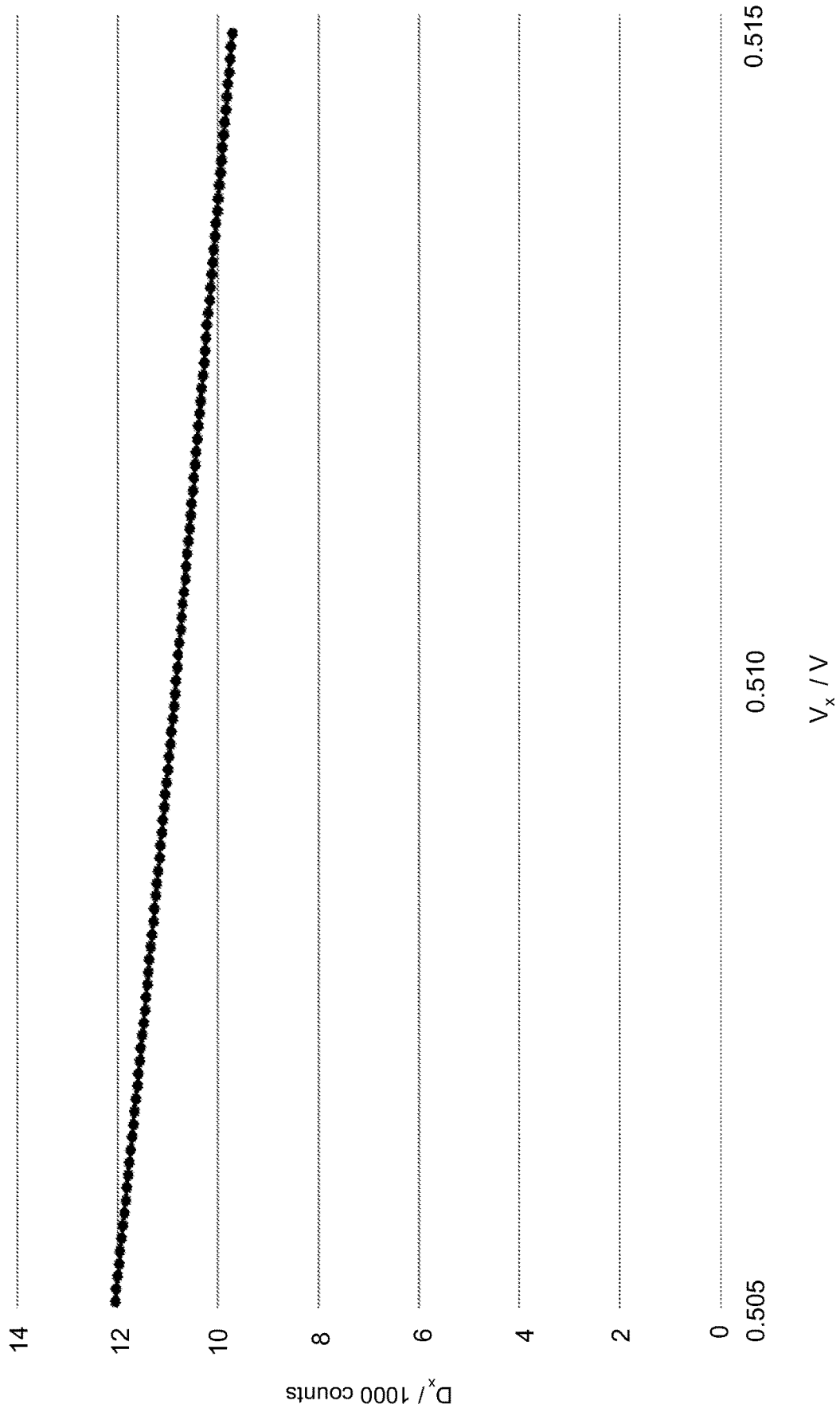
FIG. 6 is an example plot of counter output as a function of input voltage.

FIG. 6 illustrates an example plot of counter output $$D_x = \frac{f_h}{f_{Lx}}$$

as a function of input voltage $V_x$ 107 for an example voltage to frequency converter circuit with $f_h$=100 MHz. The gradient of the relationship is approximately 24 counts per 100 μV, meaning that 1 count corresponds to a voltage $V_x$ of approximately 4 μV.

Figure 7:
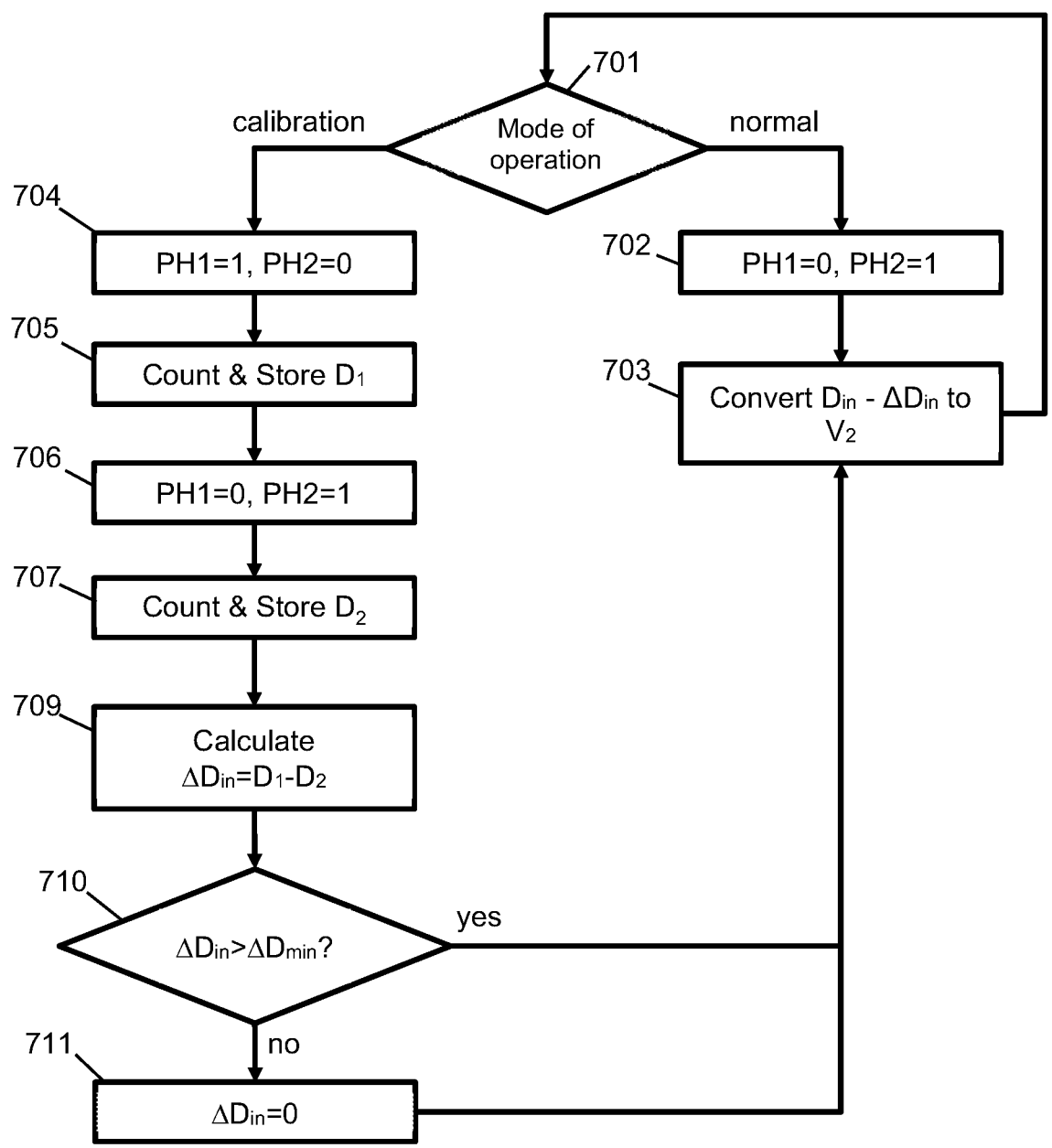
FIG. 7 is an example flow diagram illustrating a method of calibrating a buffered-voltage DAC.

FIG. 7 is flow diagram illustrating an example method of operating the self-calibrated buffered-voltage DAC 300. The method may be carried out under control of the controller 313 as described above. In a first step 701, a mode of operation is determined. In a normal mode of operation, the switching signals PH1, PH2 are provided to close the second switch 106 and open the first switch 105 (step 702), thereby converting the input digital signal $D_{in}$, together with any digital offset $\Delta D_{in}$, to the DAC 101 and providing an output analog voltage signal $V_2$ (step 703). In a calibration mode, the digital input signal $D_{in}$ is disabled and the switching signals PH1, PH2 are provided to close the first switch 105 and open the second switch 106 (step 704), causing the first analog voltage signal $V_1$ to be converted to a first frequency $f_{L1}$ and a first digital output value $D_1$ counted and stored (step 705). The switching signals PH1, PH2 are then reversed (step 706), causing the second analog voltage signal $V_2$ to be converted to a second frequency $f_{L2}$ and a second digital output value $D_2$ counted and stored (step 707).

A difference between the first and second digital output values is then calculated (step 709). This difference is compared to a minimum threshold value (step 710) and, if the minimum threshold value is exceeded this is applied as an offset to the digital input signal $D_{in}$ (step 703), otherwise the offset correction is set to zero (step 711).

The calibration mode may be performed in parallel with other modules operating alongside the DAC circuit and may be performed at regular intervals to maintain accuracy of the DAC, for example during variations in the offset voltage due to temperature variations. When the circuit is operating in normal mode, the components involved in calibration do not need to consume power. An advantage of the circuit as described herein is that the absolute accuracy of the op-amp can be reduced, thereby reducing the die area occupied by the op-amp, resulting in either a similar overall die area being taken up by the circuit or a reduced area overall.

From reading the present disclosure, other variations and modifications will be apparent to the skilled person. Such variations and modifications may involve equivalent and other features which are already known in the art of digital to analog converters, and which may be used instead of, or in addition to, features already described herein.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

Features which are described in the context of separate embodiments may also be provided in combination in a single embodiment. Conversely, various features which are, for brevity, described in the context of a single embodiment, may also be provided separately or in any suitable subcombination. The applicant hereby gives notice that new claims may be formulated to such features and/or combinations of such features during the prosecution of the present application or of any further application derived therefrom.

For the sake of completeness it is also stated that the term "comprising" does not exclude other elements or steps, the term "a" or "an" does not exclude a plurality, a single processor or other unit may fulfil the functions of several means recited in the claims and reference signs in the claims shall not be construed as limiting the scope of the claims.

The invention claimed is:

1. A self-calibrating buffered-voltage DAC circuit comprising:
   a DAC configured to receive an input digital signal and output a first analog voltage signal;
   a buffer amplifier configured to receive the first analog voltage signal from the DAC and provide a buffered second analog voltage signal;
   a voltage to frequency converter configured to selectively receive the first analog voltage signal and the second analog voltage signal and provide first and second output signals at respective first and second frequencies;
   a counter configured to receive the first and second output signals from the voltage to frequency converter and provide respective first and second digital output signals corresponding to the respective first and second frequencies;
   a comparator configured to receive the first and second digital output signals and provide a digital calibration offset; and
   a DAC error code module configured to receive a digital input code and the digital calibration offset and to provide an offset corrected input digital signal to the DAC.

2. The self-calibrating buffered-voltage DAC circuit of claim 1, further comprising:
   a first switch switchably connecting an output of the DAC to an input of the voltage to frequency converter; and
   a second switch switchably connecting an output of the buffer amplifier to the input of the voltage to frequency converter.

3. The self-calibrating buffered-voltage DAC circuit of claim 2, further comprising a controller configured to provide first and second switching signals to control operation of the respective first and second switches.

4. The self-calibrating buffered-voltage DAC circuit of claim 3, wherein the controller is configured to:
   provide the first and second switching signals to open the first switch and close the second switch in a normal operation mode; and
   provide the first and second switching signals to sequentially open and close the first and second switches to sequentially provide the first and second voltage signals to the voltage to frequency converter in a calibration mode.

5. The self-calibrating buffered-voltage DAC circuit of claim 1, further comprising a clock signal generator configured to provide a clock signal at a clock signal frequency to the counter, the counter configured to provide the first and second digital output signals by dividing the clock signal frequency by the respective first and second frequencies.

6. The self-calibrating buffered-voltage DAC circuit of claim 5, further comprising a first frequency divider configured to divide the frequency of the clock signal to provide a divided clock signal to the counter.

7. The self-calibrating buffered-voltage DAC circuit of claim 5, further comprising a second frequency divider configured to divide the frequency of the first and second analog voltage signals and provide divided first and second output signals to the counter.

8. The self-calibrating buffered-voltage DAC circuit of claim 1, further comprising a memory module comprising first and second memory slots, the memory module configured to receive the first and second digital output signals and store the first and second digital output signals in the respective first and second memory slots.

9. The self-calibrating buffered-voltage DAC circuit of claim 8, wherein the comparator is configured to receive the first and second digital output signals from the respective first and second memory slots.

10. The self-calibrating buffered-voltage DAC circuit of claim 8, wherein the memory module comprises third and fourth switches configured to switchably connect the first and second digital output signals to the respective first and second memory slots.

11. The self-calibrating buffered-voltage DAC circuit of claim 1, wherein the comparator module is configured to calculate the digital calibration offset as a difference between the first and second digital output signals.

12. The self-calibrating buffered-voltage DAC circuit of claim 1, wherein the DAC error code module comprises a DAC error code logic module configured to:
   compare the digital calibration offset to a predetermined minimum offset;

output the digital calibration offset to the DAC input summing module if the digital calibration offset is not less than the predetermined minimum offset; and output a zero value to DAC input summing module if the digital calibration offset is less than the predetermined minimum offset.

13. A method of calibrating a buffered-voltage DAC, the buffered-voltage DAC comprising a DAC configured to receive an input digital signal and provide a first analog voltage signal, and a buffer amplifier configured to receive the first analog voltage signal from the DAC and provide a buffered second analog voltage signal, the method comprising:

providing the first analog voltage signal to a voltage to frequency converter;

measuring a first frequency from a first output of the voltage to frequency converter;

providing the buffered second analog voltage signal to the voltage to frequency converter;

measuring a second frequency from a second output of the voltage to frequency converter;

calculating a difference between the first and second frequencies;

determining a digital calibration offset from the difference;

combining the digital calibration offset with an input digital signal to provide an offset corrected input digital signal; and providing the offset corrected input digital signal to the DAC.

14. The method of claim 13, further comprising:

connecting an output of the DAC to an input of the voltage to frequency converter with a first switch; and connecting an output of the buffer amplifier to the input of the voltage to frequency converter with a second switch.

15. The method of claim 14, further comprising:

providing, by a controller, first and second switching signals to control operation of the respective first and second switches.

16. The method of claim 15, wherein the controller:

provides the first and second switching signals to open the first switch and close the second switch in a normal operation mode; and provides the first and second switching signals to sequentially open and close the first and second switches to sequentially provide the first and second voltage signals to the voltage to frequency converter in a calibration mode.

17. The method of claim 13, further comprising:

receiving, by a counter, the first and second output signals from the voltage to frequency converter;

providing, by the counter, respective first and second digital output signals corresponding to the respective first and second frequencies;

receiving, by a memory module comprising first and second memory slots, the first and second digital output signals and storing the first and second digital output signals in the respective first and second memory slots; and receiving, by a comparator, the first and second digital output signals and providing the digital calibration offset.

18. The method of claim 17, wherein the comparator receives the first and second digital output signals from the respective first and second memory slots.

19. The method of claim 17, wherein the memory module connects the first and second digital output signals to the respective first and second memory slots via respective third and fourth switches.

20. The method of claim 13, further comprising:

comparing, by a logic module, the digital calibration offset to a predetermined minimum offset;

outputting, by the logic module, the digital calibration offset to the DAC input summing module if the digital calibration offset is not less than the predetermined minimum offset; and outputting, by the logic module, a zero value to DAC input summing module if the digital calibration offset is less than the predetermined minimum offset.

* * * * *